US011791169B2

(12) United States Patent
Pok et al.

(10) Patent No.: US 11,791,169 B2
(45) Date of Patent: Oct. 17, 2023

(54) DUAL STEP LASER PROCESSING OF AN ENCAPSULANT OF A SEMICONDUCTOR CHIP PACKAGE

(71) Applicant: Infineon Technologies AG, Neubiberg (DE)

(72) Inventors: Pei Luan Pok, Melaka (MY); Roslie Saini bin Bakar, Melaka (MY); Chau Fatt Chiang, Melaka (MY); Chee Hong Lee, Melaka (MY); Swee Kah Lee, Melaka (MY); Yu Shien Leong, Muar Johor (MY); Jan Sing Loh, Melaka (MY); Yean Seng Ng, Melaka (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 205 days.

(21) Appl. No.: 16/993,867

(22) Filed: Aug. 14, 2020

(65) Prior Publication Data
US 2021/0050227 A1    Feb. 18, 2021

(30) Foreign Application Priority Data

Aug. 16, 2019  (DE) .......................... 102019122069.6
Nov. 15, 2019  (DE) .......................... 102019130898.4

(51) Int. Cl.
| | | |
|---|---|---|
| H01L 21/56 | (2006.01) | |
| H01L 23/29 | (2006.01) | |
| H01L 23/31 | (2006.01) | |
| H01L 23/498 | (2006.01) | |
| H01L 23/495 | (2006.01) | |

(52) U.S. Cl.
CPC ............ *H01L 21/56* (2013.01); *H01L 23/295* (2013.01); *H01L 23/3107* (2013.01); *H01L 23/49838* (2013.01); *H01L 23/49861* (2013.01); *H01L 23/495* (2013.01); *H01L 2924/181* (2013.01)

(58) Field of Classification Search
CPC ... H01L 21/56; H01L 23/295; H01L 23/3107; H01L 2924/181; H01L 23/49838; H01L 23/49861
See application file for complete search history.

(56) References Cited

U.S. PATENT DOCUMENTS

| 9,807,916 B2 | 10/2017 | Kitazaki et al. |
| 2003/0153182 A1 | 8/2003 | Yamazaki et al. |
| (Continued) | | |

FOREIGN PATENT DOCUMENTS

| CN | 104070289 B | 3/2016 |
| DE | 102011007537 A1 | 10/2012 |
| (Continued) | | |

*Primary Examiner* — Alonzo Chambliss
(74) *Attorney, Agent, or Firm* — Murphy, Bilak & Homiller, PLLC

(57) ABSTRACT

A method for fabricating an electronic device includes providing an encapsulant having an encapsulation material, providing a first laser beam and forming a trench into a main surface of the encapsulant by removing the encapsulation material by means of the first laser beam, forming a mask along a portion above the edge of the trench, and providing a second laser beam and sweeping the second laser beam over a surface area of the main surface of the encapsulant, wherein the surface area covers at least an area spatially confined by the trench.

21 Claims, 14 Drawing Sheets

(56) References Cited

U.S. PATENT DOCUMENTS

| | | | |
|---|---|---|---|
| 2005/0003634 A1 | 1/2005 | Brown et al. | |
| 2008/0067642 A1* | 3/2008 | Koon | H01L 23/4951 |
| | | | 257/666 |
| 2013/0221543 A1* | 8/2013 | Choi | H01L 23/3135 |
| | | | 257/E23.06 |
| 2013/0249080 A1* | 9/2013 | Lin | H01L 23/3121 |
| | | | 257/737 |
| 2014/0048906 A1* | 2/2014 | Shim | H01L 21/565 |
| | | | 257/532 |
| 2014/0284791 A1* | 9/2014 | Do | H01L 24/97 |
| | | | 257/737 |
| 2015/0017784 A1 | 1/2015 | Kim | |
| 2015/0279778 A1* | 10/2015 | Camacho | H01L 23/49822 |
| | | | 257/737 |
| 2016/0256955 A1 | 9/2016 | Andrei et al. | |
| 2017/0077043 A1* | 3/2017 | Takemura | G03F 7/0035 |
| 2018/0342434 A1* | 11/2018 | Ziglioli | H01L 23/5389 |
| 2019/0115287 A1* | 4/2019 | Derai | H01L 24/73 |
| 2021/0013134 A1* | 1/2021 | Derai | H01L 24/73 |

FOREIGN PATENT DOCUMENTS

| | | | | |
|---|---|---|---|---|
| DE | 102013220880 A1 | | 4/2015 | |
| EP | 0924769 A1 | | 6/1999 | |
| EP | 3336619 A1 | * | 6/2018 | A44C 5/0007 |
| WO | 2009117451 A1 | | 9/2009 | |
| WO | 2017170172 A1 | | 10/2017 | |

\* cited by examiner

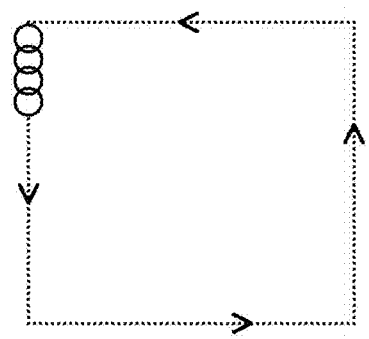
Fig. 2A
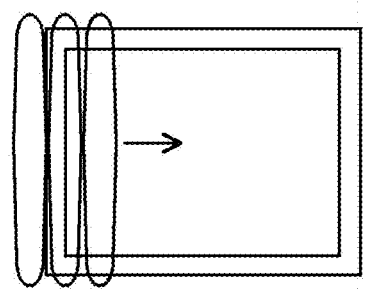
Fig. 2B
FIG. 2

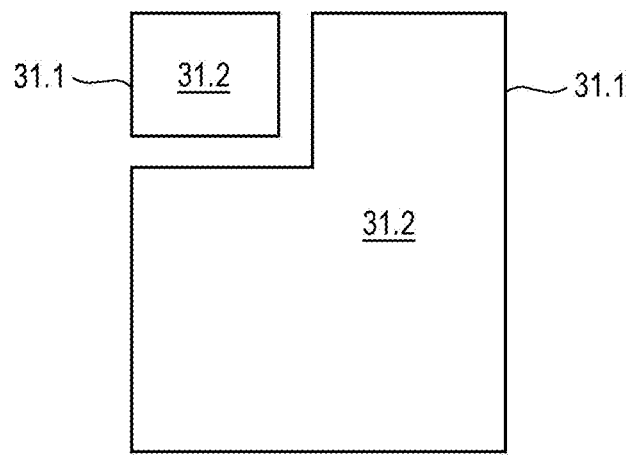
Fig. 3A
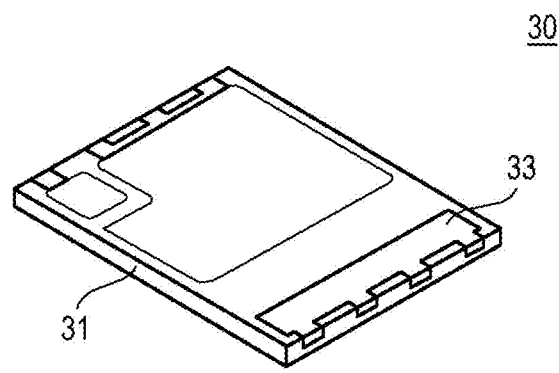
Fig. 3B
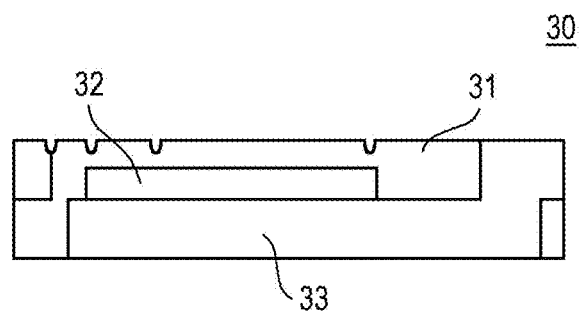
Fig. 3C
FIG. 3

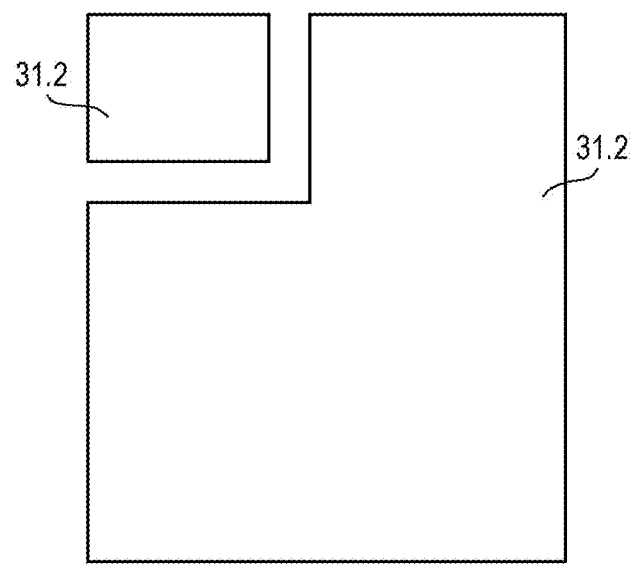
Fig. 5A
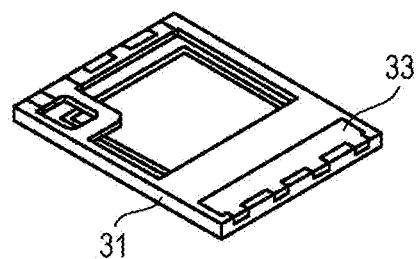
Fig. 5B
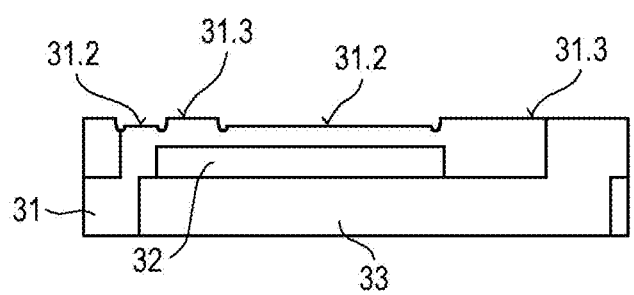
Fig. 5C
FIG. 5

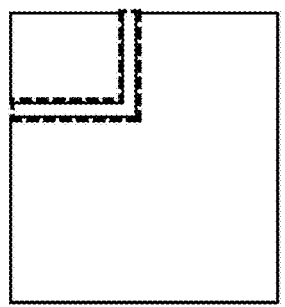
Fig. 6A
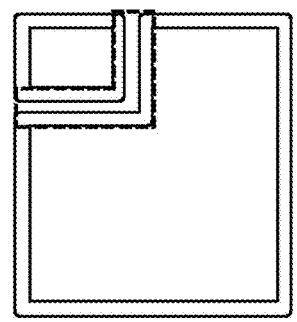
Fig. 6B
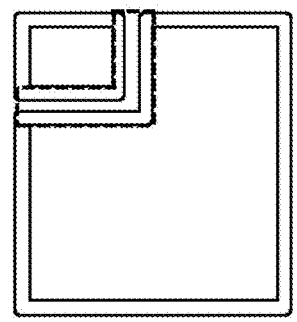
Fig. 6C
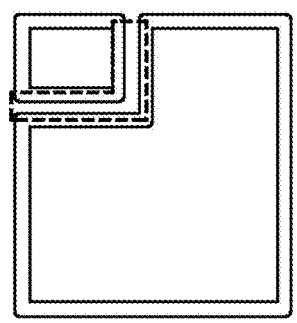
Fig. 6D
FIG. 6

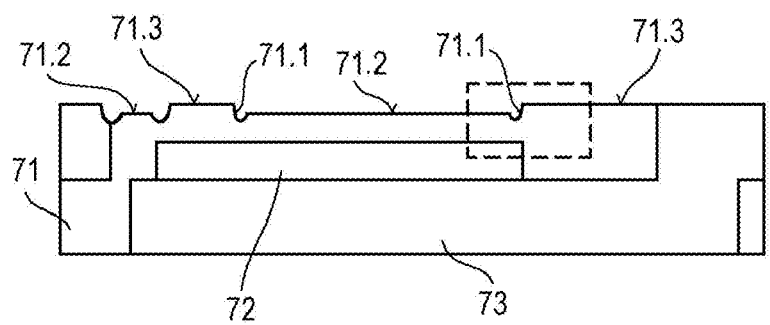
Fig. 7A
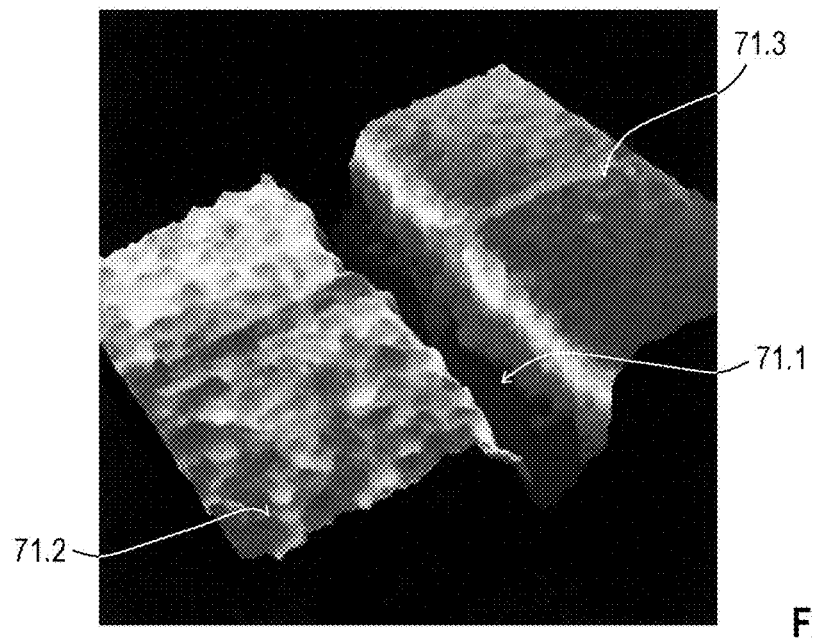
Fig. 7B
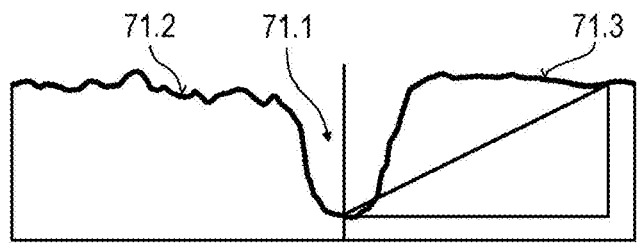
Fig. 7C
FIG. 7

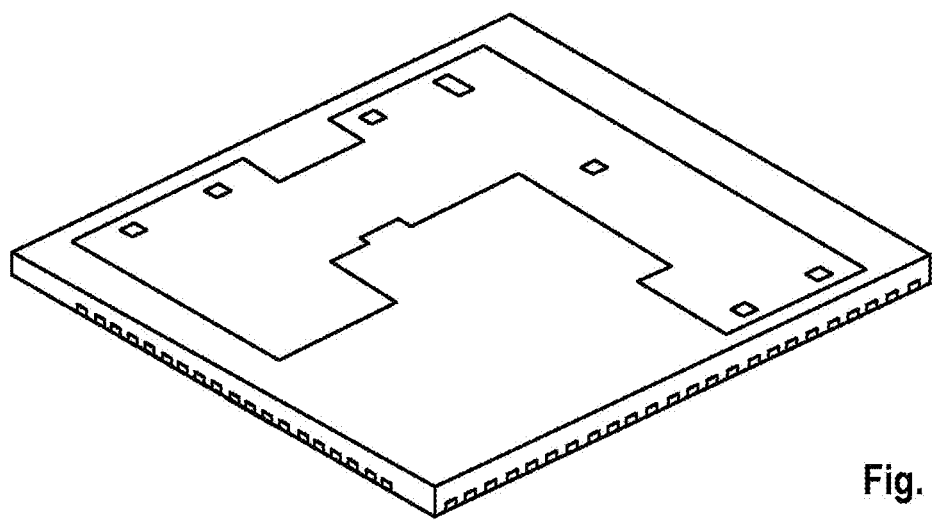
Fig. 8A
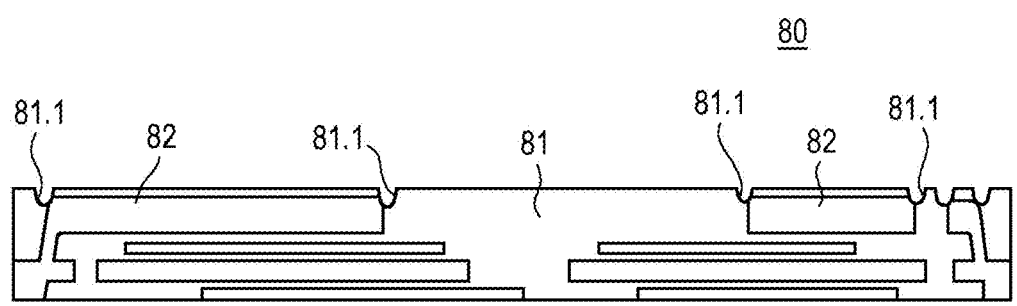
Fig. 8B
FIG. 8

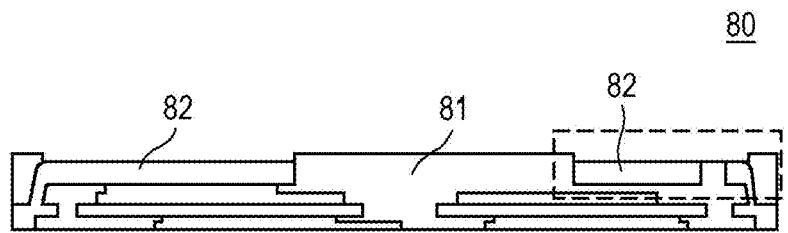
Fig. 10A
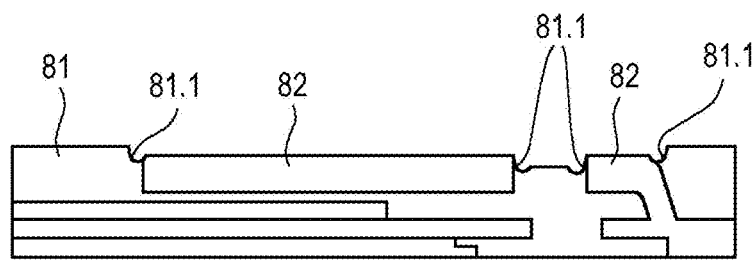
Fig. 10B
FIG. 10

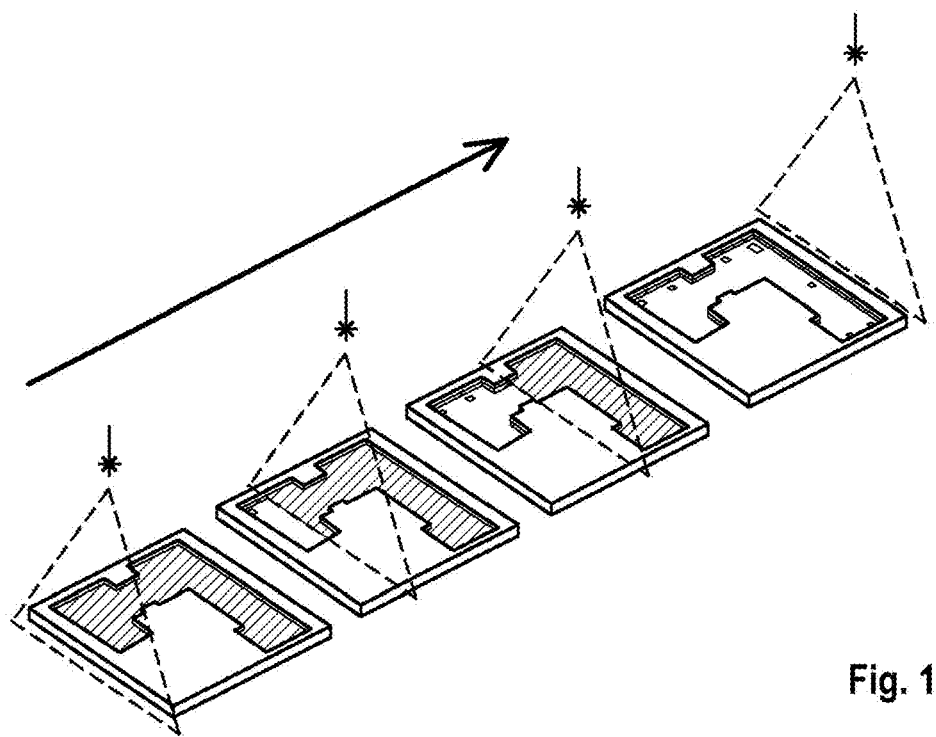
Fig. 12A
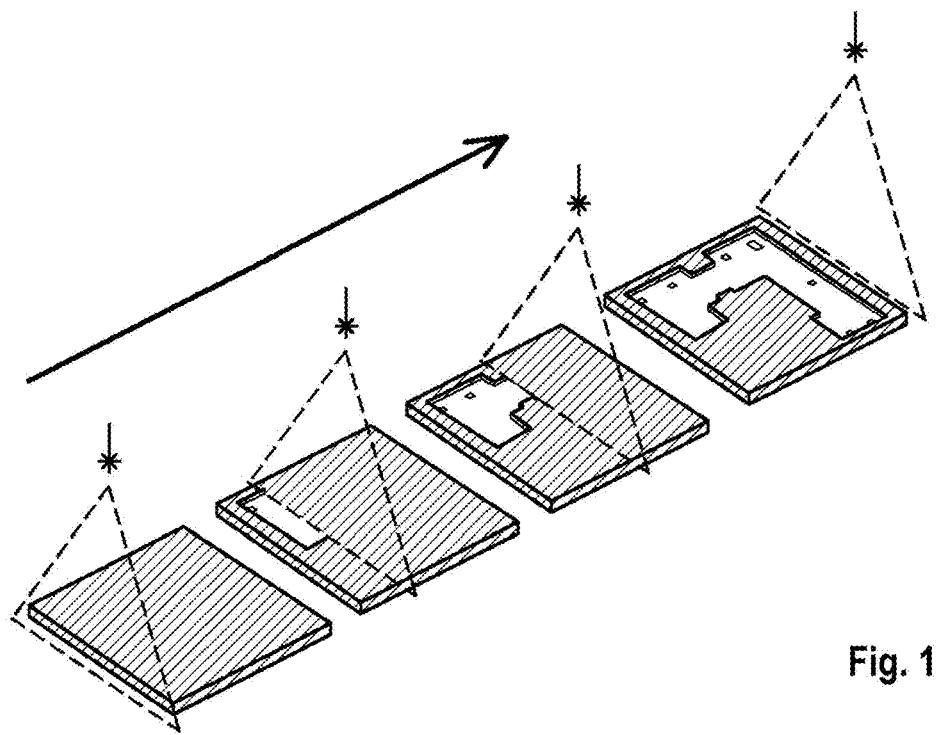
Fig. 12B
FIG. 12

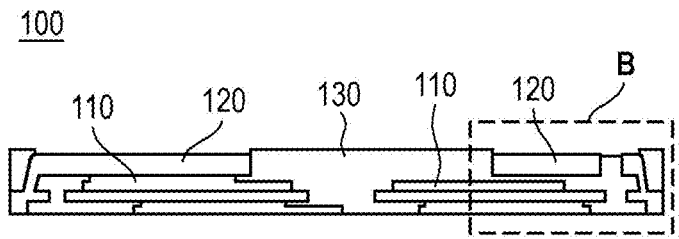
Fig. 13A
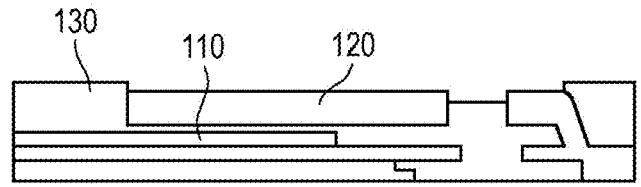
Fig. 13B
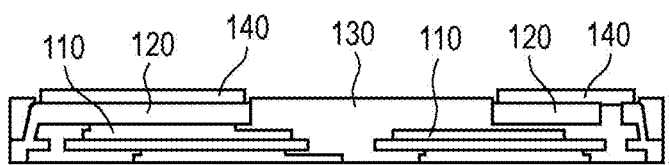
Fig. 13C
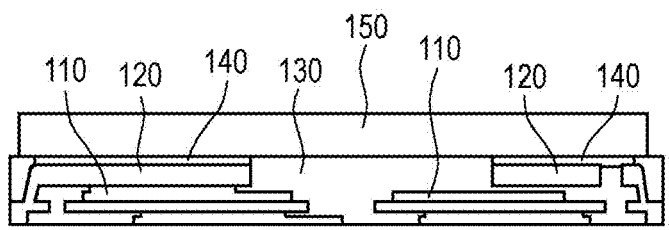
Fig. 13D
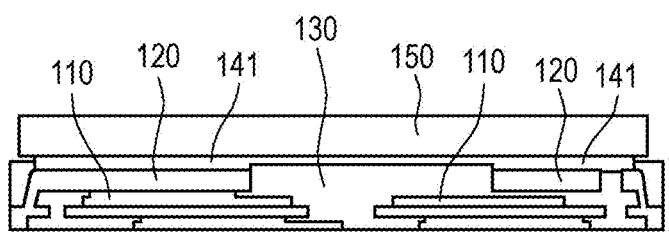
Fig. 13E
FIG. 13

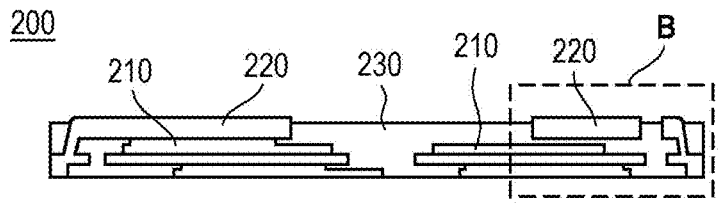
Fig. 14A
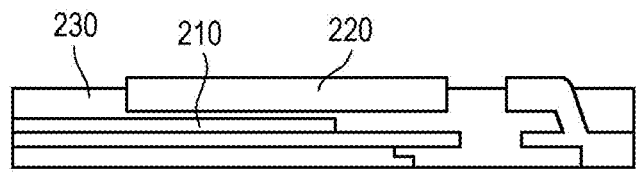
Fig. 14B
FIG. 14

DUAL STEP LASER PROCESSING OF AN ENCAPSULANT OF A SEMICONDUCTOR CHIP PACKAGE

RELATED APPLICATIONS

This application claims priority from German Patent Applications 102019122069.6 filed on Aug. 16, 2019 and 102019130898.4 filed on Nov. 15, 2019, the content of which is incorporated by reference in its entirety.

TECHNICAL FIELD

The present invention generally relates to a method for fabricating an electronic device and to semiconductor chip packages, and particularly relates to a method for fabricating an electronic device which employs two steps of processing of an encapsulant of a semiconductor chip package.

BACKGROUND

In the field of the fabrication of semiconductor chip packages, laser processing technologies become more and more important. Laser radiation can, for example, either be used to activate particular materials like, e.g., laser direct structuring (LDS) additives embedded in an encapsulation material, or to remove the encapsulation material by laser ablation. The LDS additives release metallic nuclei which can be reduced to metal to form conductive paths in a subsequent chemical plating process. Laser ablation can be employed for removing a layer of an encapsulation material and to thereby expose another layer underneath the encapsulant, for example a metallic layer. Both types of processes need further improvements concerning through-put and separation between neighboring spatial areas.

SUMMARY

A first aspect of the present disclosure is related to a method for fabricating an electronic device, comprising providing an encapsulant comprising an encapsulation material, providing a first laser beam and forming a trench into a main surface of the encapsulant by removing the encapsulation material by means of the first laser beam, forming a mask along a portion above the edge of the trench; and providing a second laser beam and sweeping the second laser beam over a surface area of the main surface of the encapsulant, wherein the surface area covers at least an area spatially confined by the trench.

A second aspect of the present disclosure is related to a semiconductor chip package, comprising an encapsulant comprising a trench formed into a main surface of the encapsulant, a first surface area of the encapsulant on one side of the trench, and a second surface area of the encapsulant on another side of the trench, wherein the first and second surface areas comprise different surface roughnesses.

A third aspect of the present disclosure is related to a semiconductor chip package, comprising an encapsulant comprising a trench formed into a main surface of the encapsulant, wherein the trench spatially confines an area in which the encapsulant is removed and thereby exposes an underlying metallic surface.

A fourth aspect of the present disclosure is related to a method for fabricating a semiconductor die package, comprising providing a semiconductor die, disposing a metallic layer above the semiconductor die, depositing an encapsulant onto the metallic layer, the encapsulant comprising an encapsulation material, and providing a laser beam and sweeping the laser beam over a surface area of the main surface of the encapsulant, wherein sweeping the laser beam comprises removing the encapsulation material of the encapsulant and thereby exposing the metallic layer.

A fifth aspect of the present disclosure is related to a semiconductor chip package, comprising a semiconductor die, a metallic layer disposed above the semiconductor die; an encapsulant disposed so as to embed the semiconductor die and to surround the metallic layer, wherein a main face of the metallic layer is exposed to the outside and is non-coplanar with a main face of the encapsulant.

Of course, the present invention is not limited to the above features and advantages. Those of ordinary skill in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 comprises FIGS. 2A and 2B and illustrates the principle of the dual step laser processing comprising a first step of forming a trench into the encapsulant by a spot-to-spot laser beam ablation (A), and a second step of sweeping a line-shaped laser beam over a surface area of the encapsulant confined by the trench (B).

FIG. 3 comprises FIGS. 3A-3C and shows an intermediate product of the process according to a first embodiment after the first step of forming a trench into the encapsulant in a schematic top view (A), a perspective view (B), and a cross-sectional side view (C).

FIG. 5 comprises FIGS. 5A-5C and shows an intermediate product of the process after the second step of sweeping the second laser beam over the surface area in a schematic top view (A), a perspective view (B), and a cross-sectional side view (C).

FIG. 6 comprises FIGS. 6A to 6D and shows schematic top views of the surface area for illustrating different masking configurations, in particular different masking design tolerances (A and B) and different masking alignment tolerances (C and D).

FIG. 7 comprises FIGS. 7A to 7C, wherein FIG. 7A corresponds to FIG. 5C and shows a semiconductor chip package according to the second aspect, a perspective image of the encircled cut-out in FIG. 7A (B), and a surface topology of the encircled cut-out (C).

FIG. 8 comprises FIGS. 8A and 8B and shows an intermediate product of the process according to a second embodiment after the first step of forming a trench into the encapsulant in a schematic top view (A), and a cross-sectional side view (B).

FIG. 10 comprises FIGS. 10A and 10B and shows a semiconductor chip package according to the third aspect obtained after the second step of sweeping the second laser beam over the surface area in a cross-sectional side view (A), and in a cross-sectional side view of the encircled area of FIG. 10A (B).

FIG. 12 comprises FIGS. 12A and 12B and shows in a perspective view the sweeping of the laser beam over a masked surface area (A) and over an unmasked surface area (B).

FIG. 13 comprises FIGS. 13A to 13E and shows a semiconductor chip package according to the fifth aspect obtained after sweeping the laser beam over the masked surface area in a cross-sectional side view (A), an enlarged view of a detail of FIG. 13A (B), the semiconductor chip package with TIM layers applied on the exposed metallic layers (C), the semiconductor chip package with a heat sink applied on top of the TIM layers and the encapsulant, and an alternative embodiment comprising only one contiguous TIM layer and a heat sink applied to the TIM layer (E).

FIG. 14 comprises FIGS. 14A and 14B and shows a semiconductor chip package according to the fifth aspect obtained after sweeping the laser beam over the unmasked surface area in a cross-sectional side view (A), and in an enlarged detail (B).

Figure 1:
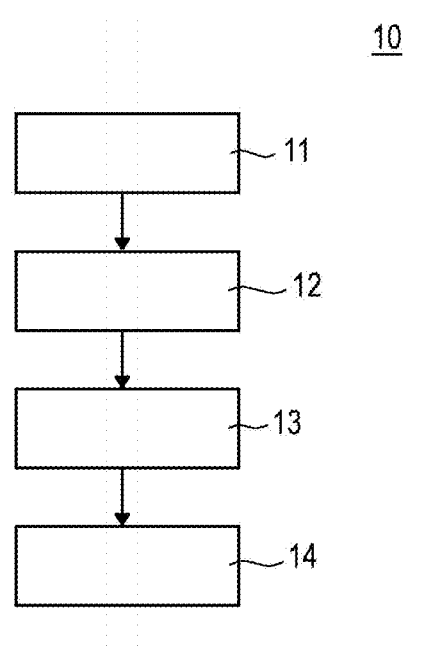
FIG. 1 shows an exemplary flow diagram of a method according to the first aspect.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

FIG. 1 shows a flow diagram for illustrating an example of the method of the first aspect. The method 10 for fabricating an electronic device comprises providing an encapsulant comprising an encapsulation material (11), providing a first laser beam and forming a trench into a main surface of the encapsulant by removing the encapsulation material by means of the first laser beam (12), forming a mask along a portion above the edge of the trench (13), and providing a second laser beam and sweeping the second laser beam over a surface area of the main surface of the encapsulant, wherein the surface area covers at least an area spatially confined by the trench (14).

According to a first example of the method of FIG. 1, the method is utilized to turn the encapsulation material of the encapsulant into a plateable encapsulation material. For this purpose, the encapsulation material comprises a laser-activatable material, in particular a laser direct structuring (LDS) additive, embedded in the encapsulation material, and sweeping the second laser beam comprises activating the laser-activatable material. According to an example thereof, the LDS additive is selected from the group consisting of any kinds of metal insulated with powder (in nano size), copper chromium oxide (spinel), copper hydroxide phosphate, copper phosphate, copper chromium oxide spinel, a copper sulfate, a cuprous thiocyanate, an organic metal complex, a palladium/palladium-containing heavy metal complex, a metal oxide, a metal oxide-coated filler, antimony doped tin oxide coated on mica, a copper containing metal oxide, a zinc containing metal oxide, a tin containing metal oxide, a magnesium containing metal oxide, an aluminum containing metal oxide, a gold containing metal oxide, a silver containing metal oxide, and a combination thereof.

According to a second example of the method of FIG. 1, the method further comprises providing a metallic layer, providing the encapsulant such that the encapsulant covering the metallic layer, wherein sweeping the second laser beam comprises removing the encapsulation material of the encapsulant and exposing the metallic layer. According to an example thereof, the trench surrounds the metallic layer and is formed at least down to an edge of the metallic layer.

According to an example of the method of FIG. 1, the first laser beam is a pulsed laser beam which is applied to the surface as a spot, wherein the first laser beam is scanned along the trench to be formed so that the spots of successive laser pulses overlap spatially on the main surface of the encapsulant. According to a further example thereof, the first laser beam comprises a pulse duration in the picosecond range. According to a further thereof, the first laser beam comprises a wavelength in the ultraviolet range.

According to an example of the method of FIG. 1, the second laser beam is a pulsed laser beam which is applied to the surface in the form of a line, wherein the second laser beam is scanned over the surface area so that the lines of successive laser pulses overlap spatially on the main surface of the encapsulant. According to a further example thereof, the second laser beam comprises a pulse duration in the nanosecond or picosecond range. According to a further example thereof, the second laser beam comprises a wavelength in the ultraviolet or visible range. According to a further example thereof, the line of the second laser beam comprises a length up to 70 mm, in particular in a range from 40 mm to 70 mm.

According to an example of the method of FIG. 1, the mask is formed of a material which is resistant against the radiation of the second laser beam, in particular a metallic material.

According to an example of the method of FIG. 1, the trench is formed to a depth in a range from 10 µm to 100 µm.

FIG. 2 comprises FIGS. 2A and 2B and illustrates the principle of the dual step laser processing. Both figures show a top view on an upper surface of an encapsulant. According to FIG. 2A in a first step a trench is formed into the encapsulant by a spot-to-spot laser beam ablation by employing a first laser beam. As shown in the example of FIG. 2A, the trench can be an annular trench surrounding a rectangular or quadratic area. The laser source of the first laser beam can be a picosecond laser as, for example, a Nd:YVO4 laser. The laser beam can be focused to a spot size of 20-25 µm, in particular 23 µm. The wavelength of the first laser beam can be in the ultraviolet range, in particular 355 nm. However, also another wavelength can be used which is suitable to ablate the material of the encapsulant. The laser beam is scanned over the surface of the encapsulant along the line as marked by the arrows. The scan speed and the repetition rate of the laser can be adjusted so that they result in a spatial overlap of successive and adjacent laser pulses of 10-15 µm, in particular 16 µm. The pulse energy of the first laser beam is preferably adjusted to slightly above the ablation threshold.

After forming the trench, a mask will be applied and disposed on the encapsulant along a portion above the edge of the trench. This will be shown and explained in somewhat more detail in the embodiment of FIGS. 3 to 5, in particular in FIG. 4.

According to FIG. 2B, in a second step a line-shaped laser beam is swept over a surface area of the encapsulant confined by the trench (B) by employing a second laser beam which is also a pulsed laser beam. The pulse length of the second laser beam can be in the picosecond or nanosecond range. The laser source can as well be a Nd:YVO4 laser and the wavelength can be, for example, 355 nm or 532 nm. The second laser beam is focused to the shape of a line, which can have a length of up to 70 mm. Preferably the length of the line is chosen such that it extends over one dimension of the area to be swept over. The second laser beam is scanned over the surface of the encapsulant as shown by the arrow. The scan speed and the repetition rate of the laser can be adjusted resulting in a spatial overlap of successive laser pulses as indicated in FIG. 2B.

According to FIG. 2B, the pulse energy of the second laser beam depends on what is to be achieved by the second laser beam. As was already indicated further above, two examples are presented in this disclosure. According to a first example, the second laser beam is employed to activate the laser-activatable LDS material, in particular the metal seed, which is embedded in the encapsulant. In this case the pulse energy of the second laser beam must be high enough to activate the LDS material, in particular to break up the bonds of the metal oxide molecule and to free the metal atoms, in particular Cu atoms. According to a second example, the second laser beam is employed to remove an encapsulant which is disposed on an underlying metal layer. In this case the pulse energy of the second laser beam must be high enough to ablate the encapsulant which also depends on the thickness of the encapsulant.

In both of the first and second examples the trench has the function of preventing heat generated in the encapsulant by the second laser beam to flow laterally outwards from the unmasked area to a masked area of the encapsulant which would otherwise result in undesired changes of the encapsulant in unmasked areas. In some embodiments, the trench provides a compensation for the inaccuracy of the masks, which can be the mismatch size of the mask or the improper position of the masks. For example, an ideal mask should be like the mask in FIG. 6C, which perfectly cover the trench and form part of the outline of the two areas. However, in practice, the mask or corresponding tools, like jig, may have a mismatch size, so that its coverage changes a little bit, like in FIG. 6D, the left size of the dot line shifts to right a little bit. Because of the existence of the trench, basically the outline of the two areas, which will be scanned by the second laser beam, is still protected. When a tool functioning as a mask, like a jig, may also positions a little bit shifted from its ideal position. Due to the trench, the outline or boundary of the to-be-scanned areas is still protected.

Figure 4:
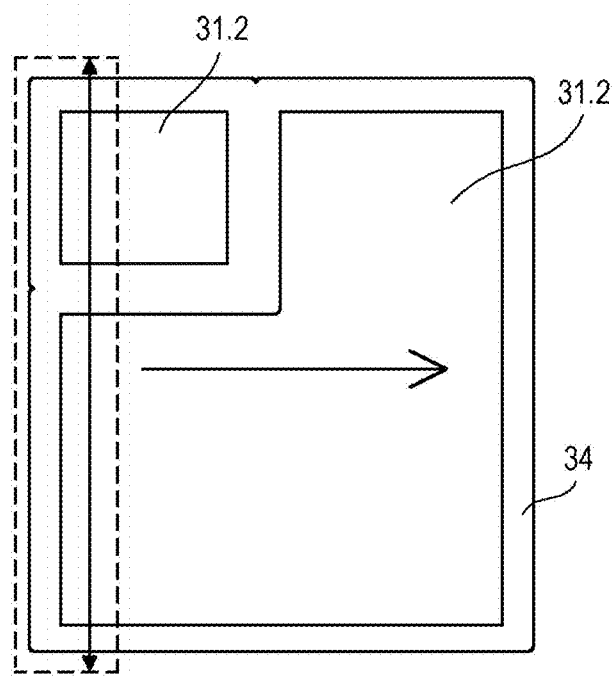
FIG. 4 comprises FIGS. 4A-4C and shows an intermediate product of the process after forming a mask layer and before performing the second step of sweeping the second laser beam over the surface area in a schematic top view (A), a perspective view (B), and a cross-sectional side view (C).
Figure 4:
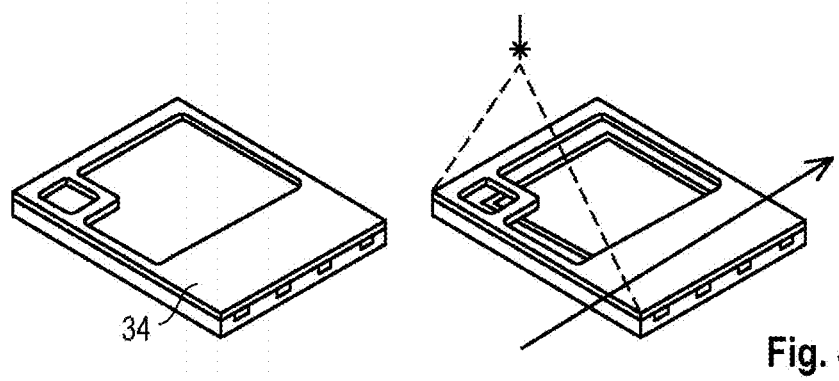
Figure 4:
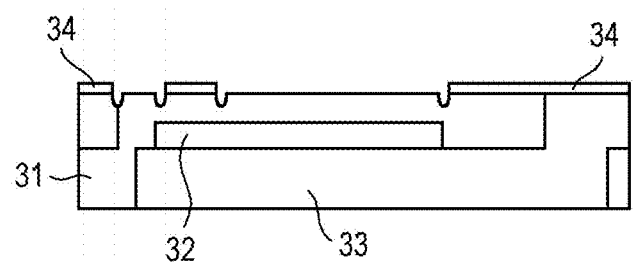

FIGS. 3 to 5 illustrate a process according to the first example in which the second laser beam is employed to turn the encapsulation material of the encapsulant into a plateable encapsulation material.

FIG. 3 comprises FIGS. 3A and 3B and shows a semiconductor chip package as an intermediate product after forming a trench into the encapsulant in a schematic top view (A), a perspective view (B), and a cross-sectional side view (C). The semiconductor chip package 30 of FIG. 3C comprises a semiconductor chip 32 disposed on a leadframe 33, and an encapsulant 31 embedding the semiconductor chip 32. The encapsulant 31 comprises an LDS material embedded therein. The semiconductor chip 32 is an IGBT chip which comprises a drain or collector terminal on its lower main surface, a source or emitter terminal on its upper main surface, and a gate or base terminal on its upper main surface. FIG. 3A shows two annular trenches 31.1 formed into the upper main surface of the encapsulant 31. These two annular trenches 31.1 encircle two first areas 31.2 which are disposed above the source and gate terminals of the IGBT chip 32. The aim is to turn the encapsulation material of these two first areas 31.2 into a plateable encapsulation material.

FIG. 4 comprises FIGS. 4A and 4B and shows the semiconductor package after forming a mask layer and before performing the second step of sweeping the second laser beam over the two first surface areas in a schematic top view (A), a perspective view (B), and a cross-sectional side view (C). The semiconductor chip package 30 is the same as the one shown in FIG. 3 but comprises an additional mask layer 34 which is deposited onto regions of the encapsulant 31 which are to be protected against the radiation of the second laser beam. FIG. 4B shows that in fact only the first surface areas above the source and gate terminals of the IGBT transistor chip are not covered by the mask layer 34. The mask layer 34 should be resistant against the radiation of the second laser beam and is preferably fabricated of a metallic material as, for example, a stainless steel material. As can be seen in FIG. 4C, the mask layer 34 is deposited beside the trenches, in particular along a portion above the edge of the trench, respectively.

FIG. 5 comprises FIGS. 5A and 5B and shows the semiconductor chip package after the second step of sweeping the second laser beam over the surface area and after removing the mask layer in a schematic top view (A), a perspective view (B), and a cross-sectional side view (C). By treatment of the second laser beam the encapsulation material of the two first surface areas has been turned into a plateable encapsulation material. The two first surface areas are thus in a condition so that metallic layers can be deposited thereupon by galvanic plating. It can also be seen in FIG. 5C that the laser treatment of the two first surface areas has led to a slight thinning of the encapsulant as compared to regions which were not treated by the second laser beam.

FIG. 6 comprises FIGS. 6A to 6D and shows schematic top views of the surface area for illustrating different conditions of masking dependent on the dimensions of the trenches and the masking design and masking alignment tolerances. In particular, FIG. 6A illustrates a rather small trench area that requires a corresponding small width of the masking layer. FIG. 6B shows that in case of wider trench area, the masking area can also be enlarged. In case of an first laser beam having a boundary of 100 mm width, there is overlapping area to compensate tolerance from the mask. FIG. 6C shows an example for a masking area (dotted line) which is no offset position. On the other hand FIG. 6D shows a masking area (dotted line) which is an offset position.

FIG. 7 comprises FIGS. 7A to 7C, wherein FIG. 7A shows a semiconductor chip package according to the second aspect, a perspective image of the encircled area in FIG. 7A (B), and a surface topology of the encircled area (C).

The semiconductor chip package 70 of FIG. 7A, in particular the rectangular cut-out shown in FIG. 7B, comprises an encapsulant 71 comprising a trench 71.1 formed into a main surface of the encapsulant 71, a first surface area 71.2 of the encapsulant on one side of the trench 71.1, and a second surface area 71.3 of the encapsulant 71 on another side of the trench 71.1, wherein the first and second surface areas comprise different surface roughnesses. In particular, the two first surface areas 71.2 comprise higher surface roughnesses than the second surface areas 71.3 as can also be seen in the surface profile of FIG. 7C.

The trenches 71.1 can be annular trenches each of which may surround one of the two first surface areas 71.2. It should be added, however, that in general the one or more trenches need not have an annular form. They can also spatially confine a first surface area only on one or more sides without being annular.

The chip package 70 of FIG. 7A may further comprise a semiconductor chip 72 which can be an IGBT chip, for example. The semiconductor chip 72 may be disposed on a leadframe 73 wherein in case of an IGBT chip 72 the backside drain contact is mechanically and electrically connected to the leadframe 73.

The two first surface areas 71.2 may each comprise conductive particles generated by laser-activating an LDS additive, in particular copper chromium oxide.

In a further step which is not shown and explained here in detail, metallic layers, e.g. of copper, can be deposited by galvanic plating onto the two first surface areas 71.2. These metallic layers will then serve as contact electrodes of the semiconductor transistor chip.

FIG. 8 comprises FIGS. 8A and 8B and shows a semiconductor chip package as an intermediate product after forming a trench into the encapsulant in a perspective view (A), and a cross-sectional side view (B). The semiconductor chip package 80 of FIG. 8B comprises one or more semiconductor chips, two metallic layers 82, and an encapsulant 81 embedding the semiconductor chips and the metallic layers 82. The metallic layers 82 can be made of copper, for example, and can be parts of a leadframe or a clip.

FIG. 8 further shows two annular trenches 81.1 formed into an upper main surface of the encapsulant 81. These two annular trenches 81.1 are formed in such a way that they reach at least down to the level of the upper surface of the metallic layers 82 or even below this level wherein an upper edge of the metallic layers 82 is exposed in the respective trench 81.1. A thickness of the encapsulant layer above the metallic layers 82 can be in a range from 100 nm to 5 μm.

Figure 9:
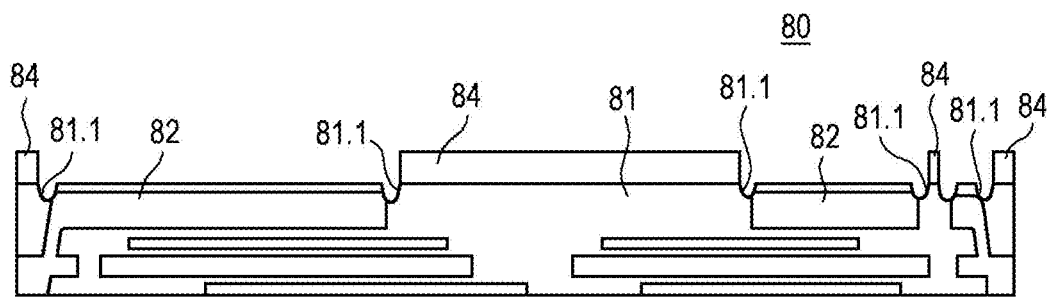
FIG. 9 comprises FIGS. 9A and 9B and shows an intermediate product of the process after forming a mask layer and performing the second step of sweeping the second laser beam over the surface area in a cross-sectional side view (A), and a perspective top view during performing the second step (B).
Figure 9:
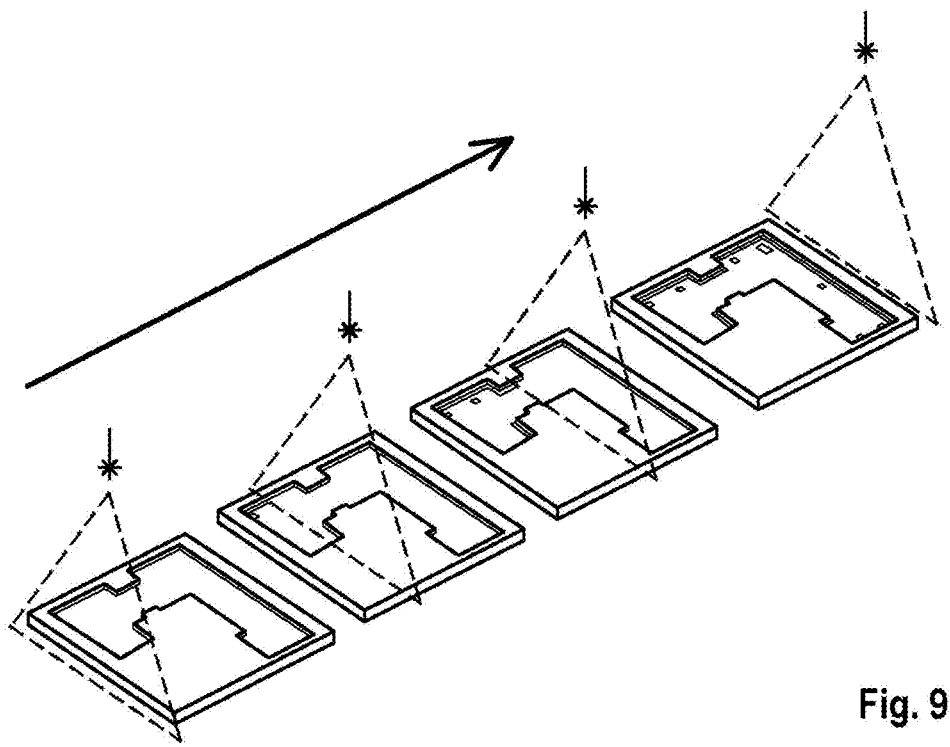

FIG. 9 comprises FIGS. 9A and 9B and shows the semiconductor package after forming a mask layer and during performing the second step of sweeping the second laser beam over the two first surface areas in a cross-sectional side view (A), and a perspective down view (B). The semiconductor chip package 80 is the same as the one shown in FIG. 8 but comprises an additional mask layer 84 which is deposited onto regions of the encapsulant 81 which are to be protected against the radiation of the second laser beam. FIG. 9A shows that in fact only the first surface areas above the metallic layers 82 are not covered by the mask layer 84. The mask layer 84 should be resistant against the radiation of the second laser beam and is preferably fabricated of a metallic material as, for example, a stainless steel material. The large arrow in FIG. 9B indicates the direction of the sweep of the line-shaped second laser beam over several semiconductor chip packages.

FIG. 10 comprises FIGS. 10A and 10B and shows a semiconductor chip package according to the third aspect obtained after the second step of sweeping the second laser beam over the surface area in a cross-sectional side view (A), and in a cross-sectional side view of the encircled area of FIG. 10A (B). By treatment of the second laser beam the encapsulation material of the encapsulant in the unmasked areas has been removed by laser ablation. As a result, the metallic layers 82 are exposed to the outside wherein a height difference between an upper surface of the metallic layers 82 and an upper surface of the encapsulant 81 can be in a range from 100 nm to 5 μm.

Also in case of the semiconductor chip package according to the third aspect, the trenches 81.1 can be annular trenches each of which may surround one of the metallic layers 82. It should be added, however, that in general the one or more trenches need not have an annular form. They can also be formed along one or more sides of a metallic layer 82 without surrounding the metallic layer 82.

Figure 11:
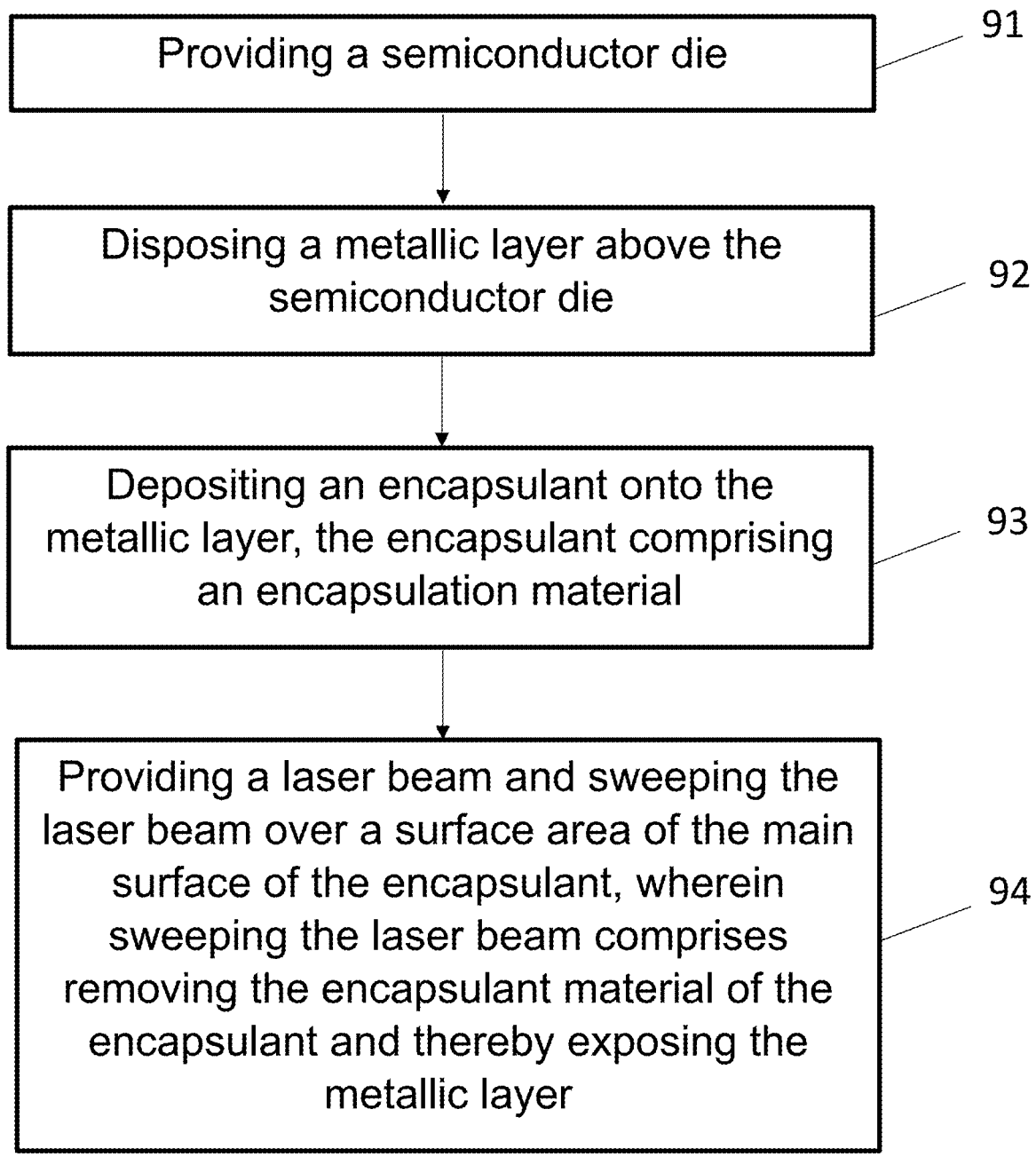
FIG. 11 shows an exemplary flow diagram of a method according to the fourth aspect.

FIG. 11 shows an exemplary flow diagram of a method according to the fourth aspect. The method 90 for fabricating a semiconductor die package comprises providing a semiconductor die (91), disposing a metallic layer above the semiconductor die (92), depositing an encapsulant onto the metallic layer, the encapsulant comprising an encapsulation material (93), and providing a laser beam and sweeping the laser beam over a surface area of the main surface of the encapsulant, wherein sweeping the laser beam comprises removing the encapsulation material of the encapsulant and thereby exposing the metallic layer (94).

According to an embodiment of the method of FIG. 11, the laser beam of the method can be generated in the same way and can have the same properties as the second laser beam of the first to third aspects of the present disclosure.

According to an embodiment of the method of FIG. 11, the method further comprises depositing a mask onto the encapsulant within the surface area before sweeping the laser beam. The mask may comprise any material which is resistive against the laser beam, in particular a metallic material, in particular Al.

According to another embodiment of the method of FIG. 11, the method does not comprise depositing a mask onto the encapsulant within the surface area before sweeping the laser beam. Hence in this embodiment there is no selective opening in the encapsulant and the metallic layer is completely covered by the encapsulant.

According to an embodiment of the method of FIG. 11, the method further comprises disposing a thermal interface material layer onto the exposed metallic layer after sweeping the laser beam over the surface area and exposing the metallic layer. According to a further example thereof, the method further comprises disposing a heat sink onto the thermal interface material layer. With such an arrangement an enhanced heat dissipation can be achieved. The metallic layer can be, for example, a clip or a part of a leadframe.

FIG. 12 comprises FIGS. 12A and 12B and shows illustrates in a perspective view the sweeping of the laser beam over a masked surface area (A) and over an unmasked surface area (B). In FIG. 12A the mask is shown as a bright area and the mask opening is shown as a dark area in which the encapsulant is exposed. The mask comprises a clip expose profile which means that the mask opening comprises exactly the same lateral profile as the clip which is disposed underneath the encapsulant. In contrast to this, in FIG. 12B there is no mask so that before the sweeping starts, the entire surface is covered by the encapsulant. When the laser beam reaches the surface area of the metallic layer, the laser beam removes the encapsulant disposed above the metallic layer.

FIG. 13 comprises FIGS. 13A to 13E and shows a semiconductor chip package according to the fifth aspect obtained after sweeping the laser beam over a surface area comprising a mask as was shown in FIG. 12A.

The semiconductor chip package 100 as shown in FIG. 13A comprises a semiconductor dies 110, a metallic layers 120 disposed above the semiconductor dies 110, an encapsulant 130 disposed so as to embed the semiconductor dies 110 and to surround the metallic layers 120 wherein an upper main face of the metallic layers 120 is exposed to the outside and is non-coplanar with an upper main face of the encapsulant 130.

In the semiconductor chip package 100 of FIG. 13 the non-coplanarity between the upper main faces of the metallic layers 120 and the encapsulant 130 is such that the upper main face of the metallic layers 120 is recessed. Due to the mask, only the encapsulant 130 disposed on the metallic layers 120 is removed, but not the encapsulant 130 outside of the metallic layers 120. Therefore after removing the mask the upper surface of the encapsulant 130 is higher than the upper surface of the metallic layers 120. The difference in height can be in the range from 1 µm to 100 µm, wherein the lower bound can also be 5, 10, 15, 20, 25, 30, 35, 40, 45, or 50 µm, and the upper bound can also be 95, 90, 85, 80, 75, 70, 65, 60, 55, or 50 µm.

FIG. 13C shows the semiconductor chip package after TIM (thermal interface material) layers 140 are applied onto the exposed metallic layers 120. A thermal interface material is any material that is inserted between two components in order to enhance the thermal coupling between them. In the present embodiment will be disposed between the metallic layer 120 and a heat sink 150 which will later be applied onto the TIM layers 140. The material of the TIM layers 140 can be one or more of a thermal grease, a thermal adhesive, a thermal conductive pad like silicone, or a phase-change material. One advantage of the presence of the TIM layer in the present case is that the upper surface of the metallic layers 120 will exhibit a certain roughness after the treatment with the laser beam. Applying a heat sink directly onto the metallic layers would therefore result in a rather low actual contact area between the two components resulting in a rather bad heat transfer. The TIM layers 140 assist in improving the heat transfer between the metallic layers 120 and the heat sink 150.

FIG. 13D shows the semiconductor chip package with the heat sink 150 applied on the two TIM layers 140 and the upper surface of the encapsulant 130.

FIG. 13E shows another embodiment in which one contiguous TIM layer 141 is applied on the metallic layers 120 and the upper surface of the encapsulant the semiconductor chip package with the heat sink 150 applied on the two TIM layers 140 and the upper surface of the encapsulant 130.

FIG. 14 comprises FIGS. 14A and 14B and shows a semiconductor chip package according to the fifth aspect obtained after sweeping the laser beam over the unmasked surface area in a cross-sectional side view (A), and in an enlarged detail (B).

The semiconductor chip package 200 of FIG. 14 comprises semiconductor dies 210, metallic layers 220 disposed above the semiconductor dies 210, an encapsulant 230 disposed so as to embed the semiconductor dies 210 and to surround the metallic layers 220 wherein an upper main face of the metallic layers 220 is exposed to the outside and is non-coplanar with an upper main face of the encapsulant 230.

In the semiconductor chip package 200 of FIG. 14 the non-coplanarity between the upper main faces of the metallic layers 220 and the encapsulant 230 is such that the upper main face of the metallic layers 220 is higher than the upper surface of the encapsulant 230 between the metallic layers 220. During the sweeping of the laser beam the encapsulant layer above the metallic layers 220 is removed and at the same time the encapsulant outside the metallic layers 220 is also removed. As a result the upper surface of the layers 220 is higher than the upper surface of the encapsulant 230. The difference in height can be in the range from 1 µm to 100 µm, wherein the lower bound can also be 5, 10, 15, 20, 25, 30, 35, 40, 45, or 50 µm, and the upper bound can also be 95, 90, 85, 80, 75, 70, 65, 60, 55, or 50 µm.

It is further possible to apply a TIM layer onto the exposed upper surfaces of the metallic layers 220 and to apply a heat sink onto the TIM layer in the same way as it was described above in connection with FIGS. 13C to 13E.

The following examples pertain to further aspects of the disclosure:

Example 1 is a method for fabricating an electronic device, comprising providing an encapsulant comprising an encapsulation material, providing a first laser beam and forming a trench into a main surface of the encapsulant by removing the encapsulation material by means of the first laser beam, forming a mask along a portion above the edge of the trench, and providing a second laser beam and sweeping the second laser beam over a surface area of the main surface of the encapsulant, wherein the surface area covers at least an area spatially confined by the trench.

In example 2, the subject matter of example 1 can optionally further include that the encapsulation material comprises a laser-activatable material, in particular a laser direct structuring (LDS) additive, embedded in the encapsulation material, and sweeping the second laser beam comprises activating the laser-activatable material.

In example 3, the subject matter of example 1 can optionally further include comprising providing a metallic layer, providing the encapsulant such that the encapsulant covers the metallic layer, wherein sweeping the second laser beam comprises removing the encapsulation material of the encapsulant and exposing the metallic layer.

In example 4, the subject matter of any one of the preceding examples can optionally further include that the first laser beam is a pulsed laser beam which is applied to the surface as a spot, wherein the first laser beam is scanned along the trench to be formed so that the spots of successive laser pulses overlap spatially on the main surface of the encapsulant.

In example 5, the subject matter of example 4 can optionally further include that the first laser beam comprises a pulse duration in the picosecond range.

In example 6, the subject matter of any one of the preceding examples can optionally further include that the second laser beam is a pulsed laser beam which is applied to the surface as a line, wherein the second laser beam is scanned over the surface area so that the lines of successive laser pulses overlap spatially on the main surface of the encapsulant.

In example 7, the subject matter of example 2 and any one of the preceding examples related back to example 2 can optionally further include that the LDS additive comprises copper chromium oxide.

In example 8, the subject matter of any one of the preceding examples can optionally further include that the mask is formed of a material which is resistant against the radiation of the second laser beam, in particular a metallic material.

In example 9, the subject matter of any one of the preceding examples can optionally further include that the trench is formed to a depth in a range from 10 μm to 100 μm.

In example 10, the subject matter of example 3 and any one of the preceding examples related back to example 3 can optionally further include that the trench surrounds the metallic layer and is formed at least down to an edge of the metallic layer.

Example 11 is semiconductor chip package, comprising an encapsulant comprising a trench formed into a main surface of the encapsulant, a first surface area of the encapsulant on one side of the trench, and a second surface area of the encapsulant on another side of the trench, wherein the first and second surface areas comprise different surface roughnesses.

In example 12, the subject matter of example 11 can optionally further include that the first surface area comprises conductive particles generated by laser-activating an LDS additive, in particular copper chromium oxide, wherein the first surface area has a higher surface roughness than the second surface area.

In example 13, the subject matter of examples 11 or 12 can optionally further include further comprising a metallic layer disposed on the first surface area and, in particular, fabricated by galvanic plating.

In example 14, the subject matter of any one of the preceding examples 11 to 13 can optionally further include that the trench is an annular trench which surrounds the first surface area.

In example 15, the subject matter of any one of the preceding examples 11 to 14 can optionally further include further comprising a semiconductor transistor chip comprising two or more electrode layers which are disposed on respective two or more first surface areas and which are in particular fabricated by galvanic plating.

Example 16 is a semiconductor chip package, comprising an encapsulant comprising a trench formed into a main surface of the encapsulant, wherein the trench spatially confines an area in which the encapsulant is removed and thereby exposes an upper surface of an underlying metallic layer.

In example 17, the subject matter of example 16 can optionally further include that the trench is an annual trench which surrounds the metallic surface.

In example 18, the subject matter of example 16 or 17 can optionally further include that a bottom of the trench is disposed on the same level or lower than the upper surface of the metallic layer.

In example 19, the subject matter of any one of examples 16 to 18 can optionally further include that a difference between the upper surface of the metallic layer and an upper surface of the encapsulant is in a range from 100 nm to 5 μm.

In example 20, the subject matter of example 18 or 19 can optionally further include that the metallic layer is part of one or more of a leadframe or a clip.

Example 21 is a method for fabricating a semiconductor die package, comprising providing a semiconductor die, disposing a metallic layer above the semiconductor die, depositing an encapsulant onto the metallic layer, the encapsulant comprising an encapsulation material, and providing a laser beam and sweeping the laser beam over a surface area of the main surface of the encapsulant, wherein sweeping the laser beam comprises removing the encapsulation material of the encapsulant and thereby exposing the metallic layer.

In example 22, the subject matter of example 21 can optionally further include comprising depositing a mask onto the encapsulant within the surface area before sweeping the laser beam.

In example 23, the subject matter of example 21 or 22 can optionally further include comprising disposing a thermal interface material layer onto the exposed metallic layer.

In example 24, the subject matter of example 23 can optionally further include comprising disposing a heat sink onto the thermal interface material layer.

Example 25 is a semiconductor chip package, comprising a semiconductor die, a metallic layer disposed above the semiconductor die, an encapsulant disposed so as to embed the semiconductor die and to surround the metallic layer, wherein a main face of the metallic layer is exposed to the outside and is non-coplanar with a main face of the encapsulant.

In example 26, the subject matter of example 25 can optionally further include a thermal interface material layer disposed on the exposed main face of the metallic layer.

In example 27, the subject matter of example 26 can optionally further include a heat sink disposed on the thermal interface material layer.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for fabricating an electronic device, comprising:
    providing an encapsulant comprising an encapsulation material;
    providing a first laser beam and forming a trench into a main surface of the encapsulant by removing the encapsulation material by means of the first laser beam;
    forming a mask along a portion of the encapsulant above the edge of the trench; and
    providing a second laser beam and sweeping the second laser beam over a surface area of the main surface of the encapsulant, wherein the surface area covers at least an area spatially confined by the trench.

2. The method according to claim 1, wherein the encapsulation material comprises a laser-activatable material that comprises a laser direct structuring (LDS) additive, embedded in the encapsulation material; and wherein sweeping the second laser beam comprises activating the laser-activatable material.

3. The method according to claim 2, wherein the LDS additive comprises copper chromium oxide.

4. The method according to claim 1, further comprising:
    providing a metallic layer; and
    providing the encapsulant such that the encapsulant covers the metallic layer; wherein sweeping the second laser beam comprises removing the encapsulation material of the encapsulant and exposing the metallic layer.

5. The method according to claim 4, wherein the trench surrounds the metallic layer and is formed at least down to an edge of the metallic layer.

6. The method according to claim 1, wherein the first laser beam is a pulsed laser beam which is applied to the surface as a spot, wherein the first laser beam is scanned along the trench to be formed so that the spots of successive laser pulses overlap spatially on the main surface of the encapsulant.

7. The method according to claim 6, wherein the first laser beam comprises a pulse duration in the picosecond range.

8. The method according to claim 1, wherein the second laser beam is a pulsed laser beam which is applied to the surface as a line, wherein the second laser beam is scanned over the surface area so that the lines of successive laser pulses overlap spatially on the main surface of the encapsulant.

9. The method according to claim 1, wherein the mask is formed of a material which is resistant against the radiation of the second laser beam.

10. The method according to claim 1, wherein the trench is formed to a depth in a range from 10 µm to 100 µm.

11. A semiconductor chip package, comprising:
    an encapsulant comprising:
    a trench formed into a main surface of the encapsulant,
    a first surface area of the encapsulant on one side of the trench, and
    a second surface area of the encapsulant on another side of the trench,
    wherein the first and second surface areas comprise different surface roughnesses, and
    wherein the first surface area comprises conductive particles generated by laser-activating an LDS additive of copper chromium oxide, wherein the first surface area has a higher surface roughness than the second surface area.

12. The semiconductor chip package according to claim 11, further comprising a metallic layer disposed on the first surface area that is galvanically plated.

13. The semiconductor chip package according to claim 11, wherein the trench is an annular trench which surrounds the first surface area.

14. The semiconductor chip package according to claim 11, further comprising a semiconductor transistor chip comprising two or more electrode layers which are disposed on respective two or more first surface areas and which are galvanically plated.

15. A semiconductor chip package, comprising:
    an encapsulant comprising a trench formed into a main surface of the encapsulant, wherein the trench spatially confines an area in which the encapsulant is removed and thereby exposes an upper surface of an underlying metallic layer,
    wherein a bottom of the trench is disposed on the same level or lower than the upper surface of the metallic layer, and
    wherein the metallic layer is part of one or more of a leadframe or a clip,
    wherein a difference between the upper surface of the metallic layer and an upper surface of the encapsulant is in a range from 100 nm to 5 µm.

16. The semiconductor chip package according to claim 15, wherein the trench is an annual trench which surrounds the metallic surface.

17. A method for fabricating a semiconductor die package, comprising:
    providing a semiconductor die;
    disposing a metallic layer above the semiconductor die;
    depositing an encapsulant onto the metallic layer, the encapsulant comprising an encapsulation material; and providing a laser beam and sweeping the laser beam over a surface area of the main surface of the encapsulant, wherein sweeping the laser beam comprises removing the encapsulation material of the encapsulant and thereby exposing the metallic layer, and wherein the method further comprises disposing a thermal interface material layer onto the exposed metallic layer.

18. The method according to claim 17, comprising:
depositing a mask onto the encapsulant within the surface area before sweeping the laser beam.

19. The method according to claim 17, comprising:
disposing a heat sink onto the thermal interface material layer.

20. A semiconductor chip package, comprising:
a semiconductor die;
a metallic layer disposed above the semiconductor die;
an encapsulant disposed so as to embed the semiconductor die and to surround the metallic layer, wherein a main face of the metallic layer is exposed to the outside and is non-coplanar with a main face of the encapsulant; and
a thermal interface material layer disposed on the exposed main face of the metallic layer.

21. The semiconductor chip package according to claim 20, further comprising:
a heat sink disposed on the thermal interface material layer.

* * * * *